United States Patent
Inoue

(10) Patent No.: US 10,391,765 B2
(45) Date of Patent: Aug. 27, 2019

(54) CONTROL CIRCUIT, INK-JET HEAD SYSTEM, AND CONTROL METHOD

(71) Applicant: BROTHER KOGYO KABUSHIKI KAISHA, Nagoya-shi, Aichi-ken (JP)

(72) Inventor: Etsuteru Inoue, Obu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 19 days.

(21) Appl. No.: 15/472,619

(22) Filed: Mar. 29, 2017

(65) Prior Publication Data
US 2017/0282546 A1    Oct. 5, 2017

(30) Foreign Application Priority Data
Mar. 31, 2016    (JP) .................. 2016-073014

(51) Int. Cl.
*B41J 2/045*    (2006.01)
*H03K 19/177*    (2006.01)

(52) U.S. Cl.
CPC ......... *B41J 2/04541* (2013.01); *B41J 2/04551* (2013.01); *B41J 2/04506* (2013.01);
(Continued)

(58) Field of Classification Search
CPC .. B41J 2/04506; B41J 2/04508; B41J 2/04551; B41J 2/04548; B41J 2/04586; B41J 2/04541
See application file for complete search history.

(56) References Cited

U.S. PATENT DOCUMENTS

| 4,758,966 A | * | 7/1988 | Brooks | .................. B41J 2/37 219/216 |
| 4,875,409 A | * | 10/1989 | Condon | .................. B41J 29/393 101/93.29 |

(Continued)

FOREIGN PATENT DOCUMENTS

| JP | S64-007591 B2 | 2/1989 |
| JP | 2009-285998 A | 12/2009 |

(Continued)

OTHER PUBLICATIONS

Extended European Search Report dated Aug. 22, 2017 from EP17163677.2.

*Primary Examiner* — Lamson D Nguyen
(74) *Attorney, Agent, or Firm* — Scully, Scott, Murphy & Presser, PC

(57) ABSTRACT

A control circuit includes a memory interface and a power interface. The control circuit is configured to: read out identifiers and voltage values from a memory via the memory interface, the memory storing the identifiers and the voltage values associated with the identifiers, the identifiers identifying actuators for jetting liquid, the voltage values corresponding to values of voltages to be supplied to the actuators; based on the voltage values, associate each of the identifiers with one of power circuits; detect whether failure occurs in any of the power circuits via the power interface communicated with the power circuits each changeable in output voltage; and based on detection of the failure occurring in any power circuits, associate specified identifiers with a non-failure power circuit in which the failure does not occur, the specified identifiers associated with a failure power circuit in which the failure is detected.

16 Claims, 11 Drawing Sheets

(52) U.S. Cl.
CPC ....... *B41J 2/04508* (2013.01); *B41J 2/04548* (2013.01); *B41J 2/04581* (2013.01); *B41J 2/04586* (2013.01); *H03K 19/1776* (2013.01)

(56) References Cited

U.S. PATENT DOCUMENTS

| | | | | |
|---|---|---|---|---|
| 5,363,134 A | * | 11/1994 | Barbehenn | B41J 2/04506 347/19 |
| 5,815,180 A | * | 9/1998 | Barbour | B41J 2/04528 347/59 |
| 5,966,144 A | * | 10/1999 | Edwards | B41J 2/17566 347/19 |
| 6,520,615 B1 | | 2/2003 | Beck et al. | |
| 6,575,548 B1 | * | 6/2003 | Corrigan, III | B41J 2/04506 347/19 |
| 6,705,694 B1 | * | 3/2004 | Barbour | B41J 2/04506 347/19 |
| 6,729,707 B2 | * | 5/2004 | Corrigan | B41J 2/04506 347/12 |
| 8,899,706 B2 | * | 12/2014 | Yabuki | B41J 2/1752 347/6 |
| 2008/0278533 A1 | * | 11/2008 | Borders | B41J 2/04538 347/19 |
| 2014/0333700 A1 | * | 11/2014 | Uda | B41J 2/0451 347/50 |
| 2015/0314595 A1 | | 11/2015 | Sano | |
| 2017/0157948 A1 | * | 6/2017 | Uno | B41J 2/355 |

FOREIGN PATENT DOCUMENTS

| | | |
|---|---|---|
| JP | 2012-045913 A | 3/2012 |
| JP | 2013-158996 A | 8/2013 |

\* cited by examiner

CONTROL CIRCUIT, INK-JET HEAD SYSTEM, AND CONTROL METHOD

CROSS REFERENCE TO RELATED APPLICATION

The present application claims priorities from Japanese Patent Application No. 2016-073014 filed on Mar. 31, 2016, the disclosure of which is incorporated herein by reference in its entirety.

FIELD OF THE INVENTION

The present invention relates to a control circuit controlling power circuits which supplies voltages to actuators for jetting a liquid, an ink-jet head system including that control circuit, and a control method.

DESCRIPTION OF THE RELATED ART

An ink-jet head includes a plurality of nozzles. Each of the nozzles has a piezoelectric body and has a jetting property due to the property of the piezoelectric body. Conventionally, there have been known recording element control circuits (for example, see Japanese Examined Patent Publication No. 64-7591) which select a power source having an appropriate voltage from three power sources having different voltages according to the jetting property of each nozzle, and supply the voltage to the nozzles.

SUMMARY

However, for the recording element control circuits mentioned above, cases of fault of power sources have not been taken into consideration.

The present teaching is made in view of the above situation, and an object thereof is to provide a control circuit, an ink-jet head system and a control method which are capable of continuously driving actuators such as nozzles and the like even in the cases of fault of power sources.

DESCRIPTION OF THE EMBODIMENTS

First Embodiment

Referring to FIGS. 1 to 8, a printing apparatus according to a first embodiment will be explained below.

Figure 1:
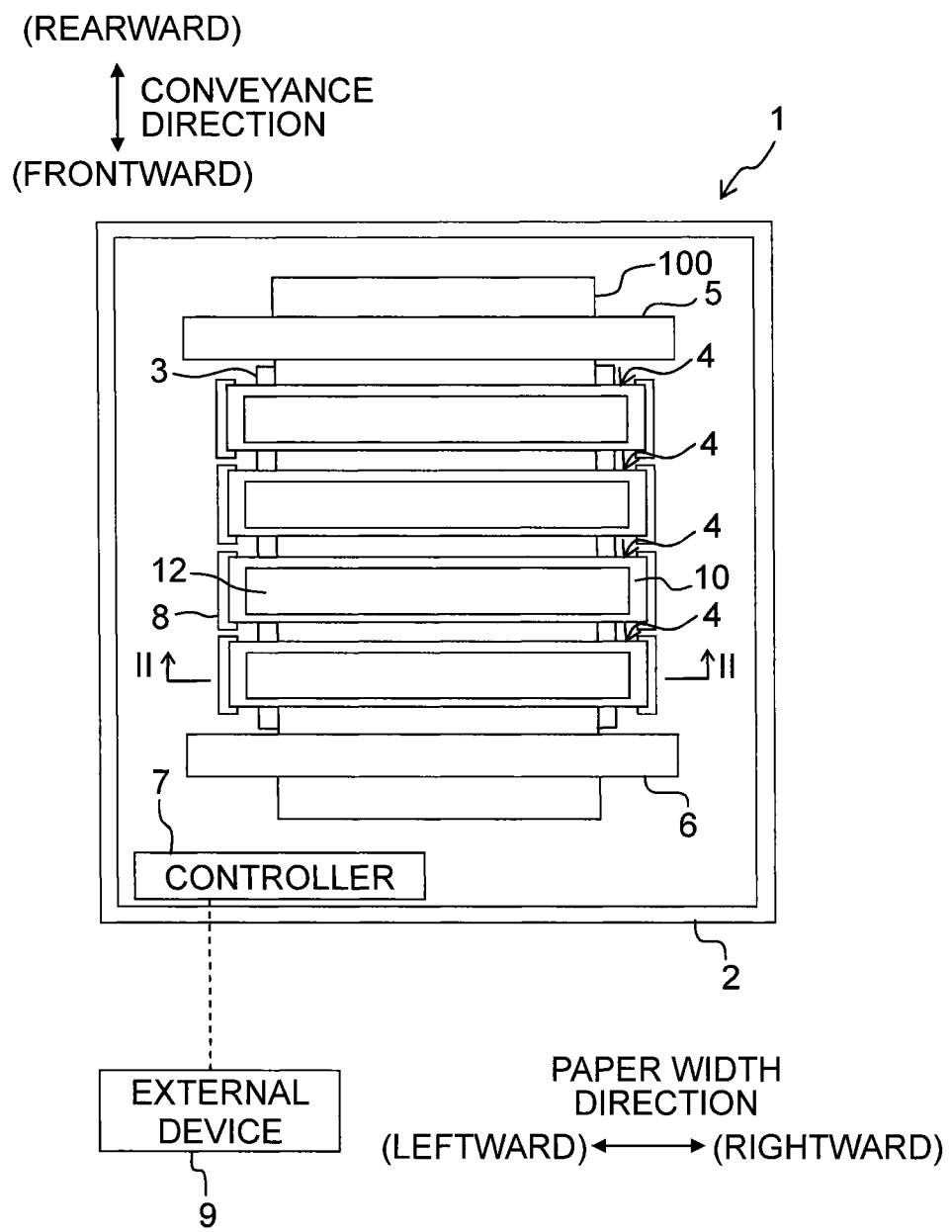
FIG. 1 is a plan view schematically depicting a printing apparatus according to a first embodiment of the present teaching.

In FIG. 1, the front side of a printing apparatus 1 is defined on the downstream side in a conveyance direction of recording paper 100, whereas the rear side of the printing apparatus 1 is defined on the upstream side in the conveyance direction. Further, the left-right direction of the printing apparatus 1 is defined in such a direction along the paper width as is parallel to the conveyance plane of the recording paper 100 (the plane parallel to the page of FIG. 1) and is orthogonal to the conveyance direction. Further, the left side of FIG. 1 is the left side of the printing apparatus 1 whereas the right side of FIG. 1 is the right side of the printing apparatus 1. Further, the upper-lower or vertical direction of the printing apparatus 1 is defined in a direction orthogonal to the conveyance plane of the recording paper 100 (a direction orthogonal to the page of FIG. 1). In FIG. 1, the front or near side of the page is the upper side whereas the rear side or far side of the page is the lower side. Those defined front, rear, left, right, upper, and lower will be used appropriately in the following explanation.

As depicted in FIG. 1, the printing apparatus 1 includes a case 2, a platen 3, four ink-jet heads 4, two conveyance rollers 5 and 6, and a controller 7.

The platen 3 is arranged in the case 2. On its upper surface, the platen 3 supports the recording paper 100 conveyed by either of the two conveyance rollers 5 and 6. The four ink-jet heads 4 are arranged above the platen 3 to align respectively in the front-rear direction. The two conveyance rollers 5 and 6 are arranged respectively on the front side and the rear side of the platen 3. The two conveyance rollers 5 and 6 are driven respectively by an undepicted motor. The motor drives the two conveyance rollers 5 and 6 to convey the recording paper 100 on the platen 3 to the front side.

The controller 7 is connected with an external device 9 such as a PC or the like in a data communicable manner. The controller 7 controls each device of the printing apparatus 1 based on print data sent from the external device 9.

For example, the controller 7 controls the motor to drive the two conveyance rollers 5 and 6 to cause the conveyance rollers 5 and 6 to convey the recording paper 100 in the conveyance direction. Further, the controller 7 controls the ink-jet heads 4 to jet inks toward the recording paper 100 while the two conveyance rollers 5 and 6 are conveying the recording paper 100. By virtue of this, image is printed on the recording paper 100.

Head holders 8 are installed in the case 2. The head holders 8 are arranged above the platen 3 and, between the two conveyance rollers 5 and 6, positioned respectively in the front-rear direction. The head holders 8 hold the ink jet heads 4, respectively.

The four ink jet heads 4 jet the inks of the four colors respectively: cyan (C), magenta (M), yellow (y), and black (K). Each of the ink-jet heads 4 is supplied with the ink of the corresponding color from an undepicted ink tank.

Figure 2:
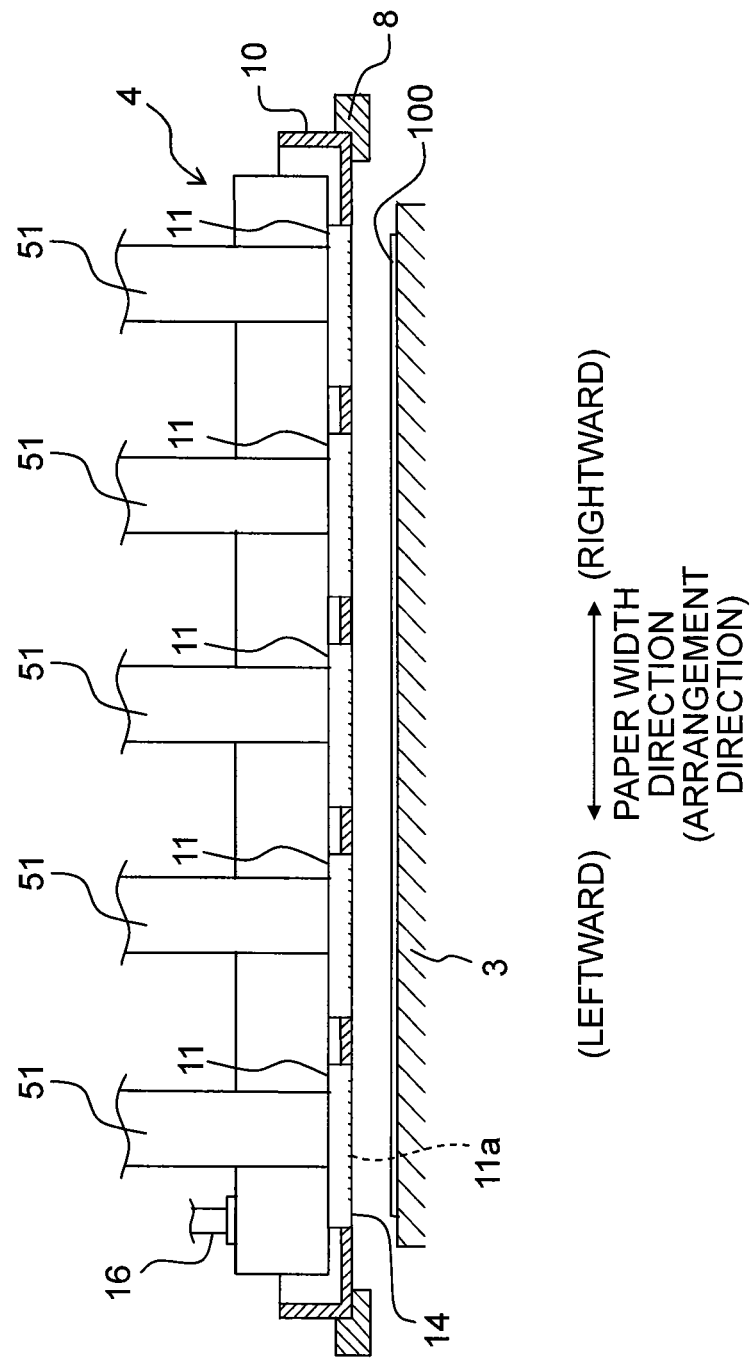
FIG. 2 is a schematic cross-sectional view taken along the line II-II in FIG. 1.

As depicted in FIG. 2, each of the ink-jet heads 4 includes a holder 10 and nine head units 11. The holder 10 is formed in a rectangular plate-like shape elongated in the paper width direction. Further, the holder 10 holds the head units 11. One ink jet head 4 may include another number of head units 11 than the number of nine.

Figure 3:
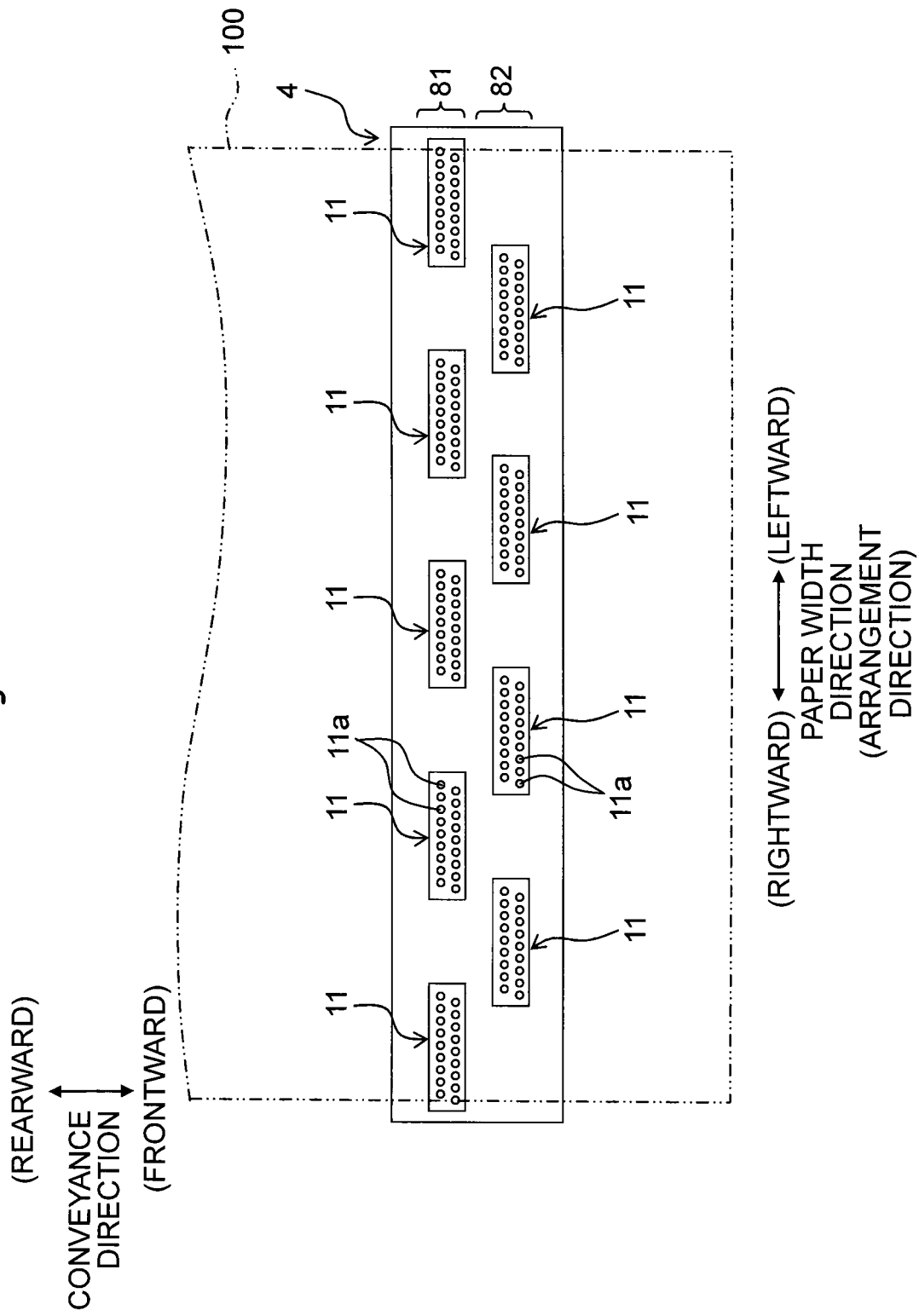
FIG. 3 is a bottom plan view of an ink jet head.

180 nozzles 11a, for example, are formed in the lower surface of each of the head units 11. FIG. 3 uses circles to represent the nozzles 11a and one head unit 11 has 18 nozzles 11a. However, while only the 18 nozzles 11a of the one head unit 11 are depicted in FIG. 3 for the sake of explanatory convenience, in actuality 180 nozzles 11a are formed in the one head unit 11. Further, one ink-jet head 4 is formed with 1620 nozzles 11a.

Figure 6:
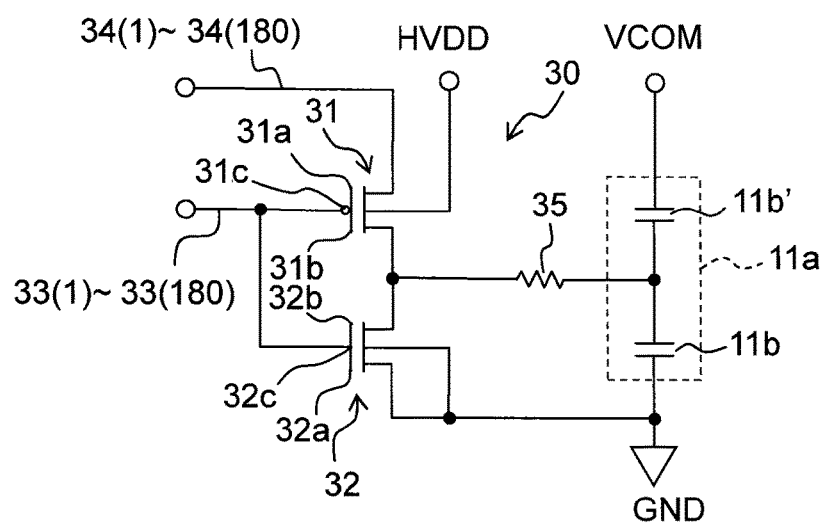
FIG. 6 is a circuit diagram schematically depicting a configuration of a CMOS (Complementary Metal-Oxide-Semiconductor) circuit for driving nozzles.

The head unit 11 includes aftermentioned 180 pairs of piezoelectric bodies 11b and 11b' (actuators) to correspond respectively to the nozzles 11a (see FIG. 6). As depicted in FIG. 3, the nozzles 11a of each of the head units 11 are formed along the paper width direction which is the longitudinal direction of the ink-jet heads 4. The nine head units 11 per se are arranged in a staggered form in the conveyance direction and in the paper width direction (arrangement direction). In the following explanations, a first head row 81 refers to the head units 11 on the rear side in the conveyance direction (on the upstream side in the conveyance direction). Further, a second head row 82 refers to the head units 11 on the front side in the conveyance direction (on the downstream side in the conveyance direction). Although the head units 11 are arranged along the paper width direction orthogonal to the conveyance direction, they may be arranged obliquely, that is, along a direction intersecting the conveyance direction at an angle other than 90 degrees.

As depicted in FIG. 3, a left end portion of each head unit 11 in the first head row 81 is at the same position in the left-right direction as a right end portion of one head unit 11 in the second head row 82. In other words, in front of the nozzles of each head unit 11 in the first head row 81 at the left end, there are positioned the nozzles of the head unit 11 in the second head row 82 at the right end.

As depicted in FIG. 2, a flexible substrate 51 is connected to each of the head units 11. The flexible substrates 51 are also connected with the controller 7. Therefore, the head units 11 are connected with the controller 7 via the flexible substrates 51.

As depicted in FIG. 1, a reservoir 12 is arranged above the head units 11.

The reservoir 12 is connected to the ink tank (not depicted) via a tube 16. Further, the reservoir 12 temporarily retains the ink supplied from the ink tank. The reservoir 12 has a lower portion connected to the head units 11. The head units 11 are supplied with the inks from the reservoir 12.

Figure 4:
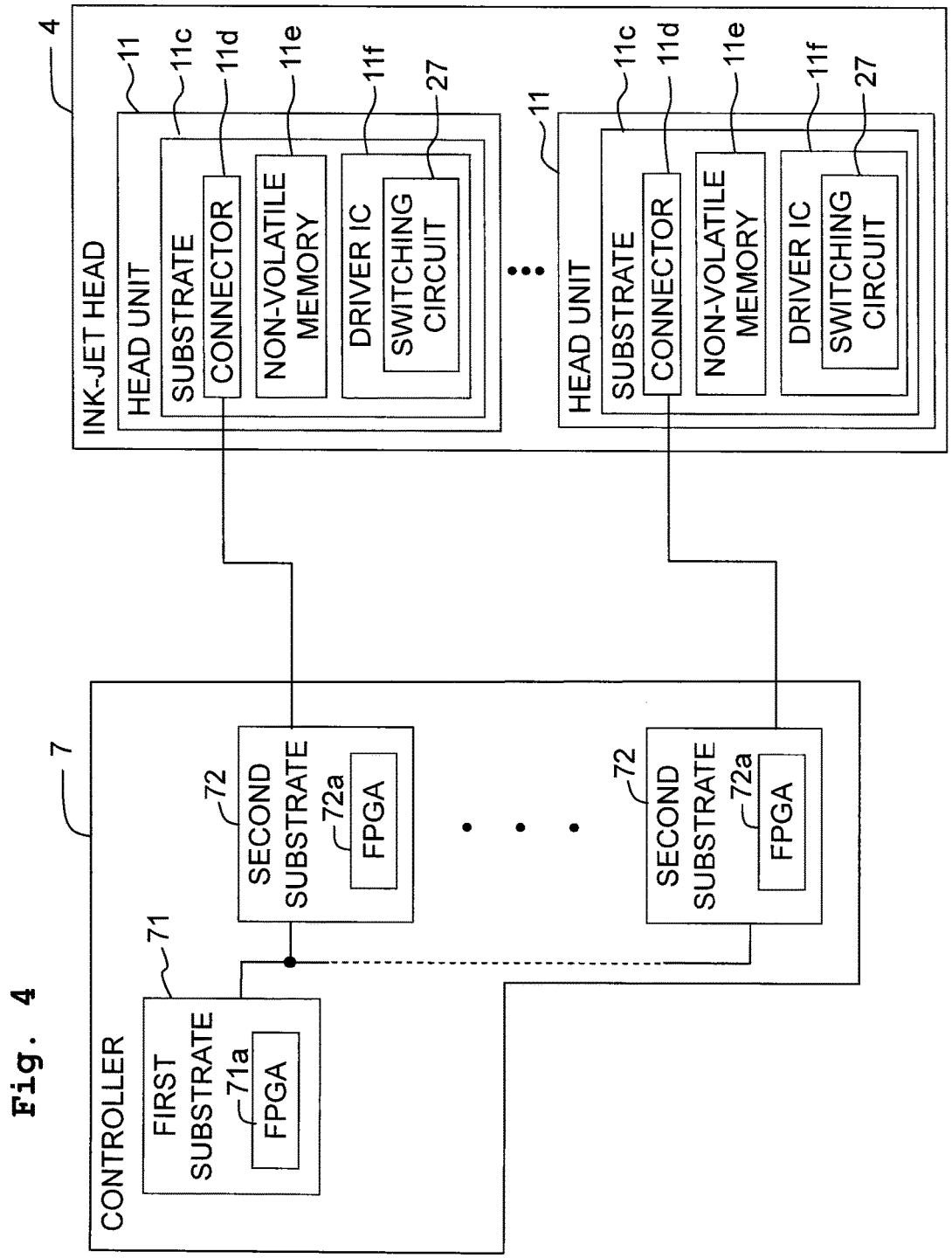
FIG. 4 is a block diagram schematically depicting connection of a controller and head units.
Figure 5:
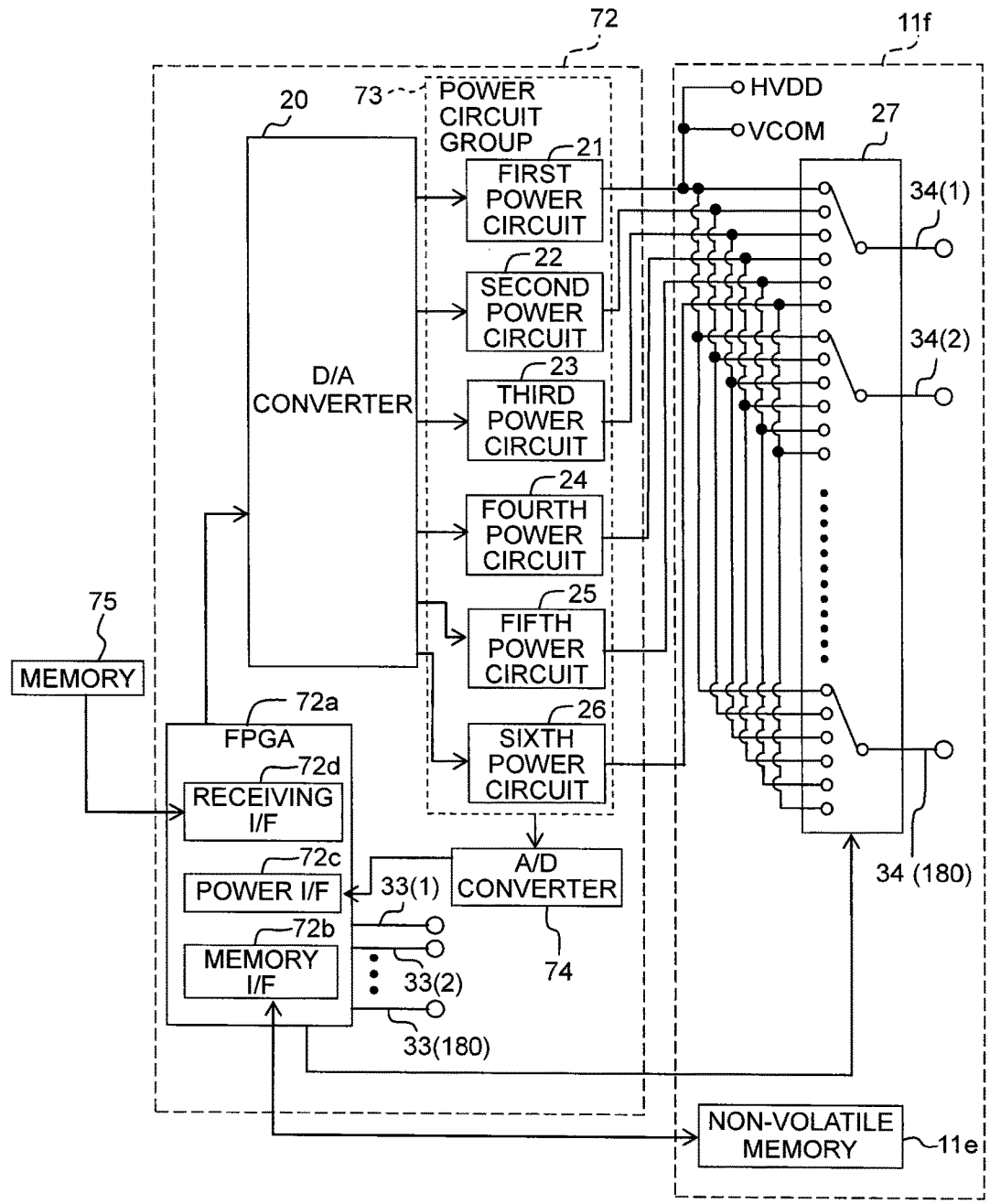
FIG. 5 is a block diagram schematically depicting a configuration in the vicinity of power circuits.

As depicted in FIG. 4, the controller 7 includes a first substrate 71 and second substrates 72. The first substrate 71 has FPGAs 71a (Field Programmable Gate Array). The second substrates 72 have FPGAs 72a, 72a, . . . and 72a, respectively. As depicted in FIG. 5, each of the FPGAs 72a includes a memory interface (memory I/F) 72b, a power interface (power I/F) 72c, and a receiving interface (receiving I/F) 72d.

The FPGAs 71a are connected to the FPGAs 72a to control the driving of the FPGAs 72a. The number of FPGAs 71a is four which is the same as the number of ink-jet heads 4. The second substrates 72, that is, the FPGAs 72a, correspond respectively to the head units 11. Hence, the number of FPGAs 72a is nine which is the same as the number of head units 11. The FPGAs 72a are connected respectively with the head units 11. That is, nine FPGAs 72a and one FPGA 71a correspond to nine head units 11 and one ink jet head 4. The numbers of FPGAs 71a, FPGAs 72a, and head units 11 are not limited to the numbers mentioned above, respectively. It is possible for head units 11 to correspond to one second substrate 72. For example, if two head units 11 correspond to one second substrate 72, then the FPGA 72a controls all of the nozzles 11a of the two head units 11, that is, 360 nozzles 11a.

As depicted in FIG. 4, each of the head units 11 includes a substrate 11c. The substrate 11c has a removable connector 11d, a non-volatile memory 11e and a driver IC 11f. Each of the head units 11 is connected to one second substrate 72 in a removable manner via the connector 11d. Each of the driver ICs 11f includes a switching circuit 27 which will be described later on.

As depicted in FIG. 5, the second substrate 72 has a D/A (Digital/Analog) converter 20. Further, the second substrate 72 has a power circuit group 73. The power circuit group 73 includes a plurality of power circuits. For example, the power circuit group 73 includes a first power circuit 21 to a sixth power circuit 26. Each of the first power circuit 21 to sixth power circuit 26 has an FET, an impedance and the like, and the output voltages thereof are changeable. Further, the second substrate 72 has an A/D converter 74.

The first power circuit 21 to the sixth power circuit 26 are connected with the FPGAs 72a via the D/A converter 20 and the A/D converter 74. The FPGA 72a outputs signals for setting output voltages to the first power circuit 21 to the sixth power circuit 26. The first power circuit 21 to the sixth power circuit 26 input the respective output voltages to the FPGA 72a via the A/D converter 74 and the power I/F 72c.

The first power circuit 21 to the sixth power circuit 26 are connected to a first power wire 34(1) to a 180th power wire 34(180) via the switching circuit 27 of the driver IC 11f. The number of power wires 34 corresponds to the nozzles 11a or the piezoelectric bodies 11b and 11b', and is the same as the number of the pairs of piezoelectric bodies 11b and 11b'. The switching circuit 27 connects each of the first power wire 34(1) to the 180th power wire 34(180) to any of the first power circuit 21 to the sixth power circuit 26. For example, the first power circuit 21 has the highest output voltage and its output side is connected to a terminal of HVDD and a terminal of VCOM.

As depicted in FIG. 6, the printing apparatus 1 includes CMOS (Complementary Metal-Oxide-Semiconductor) circuits 30 to drive the piezoelectric bodies 11b and 11b'. The number of CMOS circuits 30 corresponds to the number of pairs of piezoelectric bodies 11b and 11b' (to the number of the piezoelectric bodies 11b if only the singular piezoelectric bodies 11b are provided) and, for example, is the same as the latter. The FPGA 72a outputs gate signals to the CMOS circuits 30 via a first control wire 33(1) to a 180th control wire 33(180). The first control wire 33(1) to the 180th control wire 33(180) correspond respectively to the first power wire 34(1) to the 180th power wire 34(180). That is, the first control wire 33(1) corresponds to the first power wire 34(1), and the 180th control wire 33(180) corresponds to the 180th power wire 34(180).

The FPGA 72a outputs a signal to the switching circuit 27, for example, to connect each of the first power wire 34(1) to the 180th power wire 34(180) to any of the first power circuit 21 to the sixth power circuit 26. The FPGA 72a accesses the non-volatile memory 11e via the memory I/F 72b. The non-volatile memory 11e stores information such as nozzle addresses identifying the nozzles 11a (in other words, identifiers), voltages corresponding to the nozzle addresses, and the like. The information stored in the non-volatile memory 11e will be described later on.

An external memory 75 stores bit stream information for carrying out a voltage setting process and a resetting process which will be described later on. The FPGA 72a includes a plurality of electric circuits constituting a logic circuit. The FPGA 72a receives the bit stream information from the memory 75 via the receiving I/F 72d. Then, the FPGA 72a establishes a connecting relation between the electric circuits according to the received bit stream information. By virtue of this, the FPGA 72a constructs the logic circuit for carrying out the voltage setting process and the resetting process. The non-volatile memory 11e may store the bit stream information and the FPGA 72a may receive the bit stream information via the memory I/F 72b.

As depicted in FIG. 6, the CMOS circuit 30 includes a PMOS (P-type Metal-Oxide-Semiconductor) transistor 31, an NMOS (N-type Metal-Oxide-Semiconductor) transistor 32, an impedance 35, two piezoelectric bodies 11b and 11b', and the like. The piezoelectric bodies 11b and 11b' function as a capacitor. Only the single piezoelectric body 11b may be provided. The source terminal 31a of the PMOS transistor 31 is connected to, for example, the nth power wire 34(n). The source terminal 32a of the NMOS transistor 32 is grounded.

The drain terminals 31b and 32b of the PMOS transistor 31 and NMOS transistor 32 are connected to one end of the impedance 35. The other end of the impedance 35 is connected to the other end of the piezoelectric body 11b' on one hand and to one end of the piezoelectric body 11b on the other hand. One end of the piezoelectric body 11b' on the one hand is connected to the terminal of VCOM (common power source) whereas the other end of the piezoelectric body 11b on the other hand is grounded.

The gate terminals 31c and 32c of the PMOS transistor 31 and the NMOS transistor 32 are connected to any of the first control wire 33(1) to the 180th control wire 33(180). One of the first control wire 33(1) to the 180th control wire 33(180) corresponds to the power wire connected to the source terminal 31a of the PMOS transistor 31. The PMOS transistor 31 is connected to the terminal of HVDD (the power source on the drain side).

If the FPGA 72a inputs an output signal "L" to the gate terminals 31c and 32c of the PMOS transistor 31 and the NMOS transistor 32, then the PMOS transistor 31 is conducted. Thus, the piezoelectric body 11b is charged whereas the piezoelectric body 11b' is discharged. If the FPGA 72a inputs an output signal "H" to the gate terminals 31c and 32c of the PMOS transistor 31 and the NMOS transistor 32, then the NMOS transistor 32 is conducted. Thus, the piezoelectric body 11b is discharged whereas the piezoelectric body 11b' is charged. Charging and discharging the piezoelectric bodies 11b and 11b' cause the piezoelectric bodies 11b and 11b' to deform. Deformation of the piezoelectric bodies 11b and 11b' causes the inks to be jetted from the nozzle 11a.

The non-volatile memory 11e has a first storage area and a second storage area. The first storage area stores, for example, a data table as the initial value as depicted in the following table 1. The second storage area stores a data table after the aftermentioned resetting process.

TABLE 1

| | | identifier | | | |
|---|---|---|---|---|---|
| | set voltage | ch1 | ch2 | ... ch180 | ratio |
| first power circuit | 31 V | 0 | 0 | ... 0 | 2% |
| second power circuit | 29 V | 0 | 0 | ... 1 | 10% |
| third power circuit | 27 V | 0 | 1 | ... 0 | 30% |
| fourth power circuit | 25 V | 1 | 0 | ... 0 | 35% |
| fifth power circuit | 23 V | 0 | 0 | ... 0 | 20% |
| sixth power circuit | 21 V | 0 | 0 | ... 0 | 3% |

In the above table, the "set voltage" indicates the output voltages set in the first power circuit 21 to the sixth power circuit 26. The "identifier" indicates the identifier identifying each nozzle 11a. For example, the total number of nozzles 11a is 180, and the nozzles 11a are assigned respectively with the identifiers "ch1" to "ch180". That is, the "ch1" corresponds to the first nozzle 11a, the "ch2" corresponds to the second nozzle 11a, and the "ch180" corresponds to the 180th nozzle 11a.

In each column of the identifiers "ch1" to "ch180", "1" is set for the power circuit having output voltage to be applied to the nozzle 11a corresponding to the identifier, whereas "0" is set for the other power circuits. In the table 1, for example, the fourth power circuit (its output voltage is 25V) has the output voltage to be applied to the first nozzle 11a corresponding to "ch1". The first nozzle 11a corresponding to "ch1" is not set with the output voltages of the first to third power circuits and of the fifth and sixth power circuits. Further, for example, the third power circuit (its output voltage is 27V) has the output voltage to be applied to the second nozzle 11a corresponding to "ch2". Further, for example, the second power circuit (its output voltage is 29V) has the output voltage to be applied to the 180th nozzle 11a corresponding to "ch180".

The "ratio" indicates the ratio of the number of nozzles corresponding to each of the first power circuit 21 to the sixth power circuit 26, to the total number (that is, 180) of nozzles included in one head unit 11. In the table 1, for example, because the ratio of the third power circuit 23 is 30%, the number of nozzles set at the voltage (27V) outputted by the third power circuit 23 is 54. Further, for example, because the ratio of the fifth power circuit 25 is 20%, the number of the nozzles set at the voltage (23V) outputted by the fifth power circuit 25 is 36. The data table may store the number of nozzles corresponding to each of the first power circuit 21 to the sixth power circuit 26, instead of the "ratio".

The FPGA 72a carries out the voltage setting process (see FIG. 7) to set the output voltage for each of the first power circuit 21 to the sixth power circuit 26. The FPGA 72a stands by until receiving a power source setting request from the external device 9 (step S1: No).

If the FPGA 72a receives the power source setting request from the external device 9 (step S1: Yes), then the FPGA 72a determines whether such information is received from the external device 9 as to indicate failure of the power circuits 21 to 26 (step S2). Further, if a memory of the external device 9 stores the information indicating failure of the power circuits 21 to 26 in submitting the power source setting request, then the external device 9 sends the FPGA 72a the information indicating failure of the power circuits 21 to 26.

If the information indicating failure of the power circuits 21 to 26 is not received from the external device 9 (step S2: No), then the FPGA 72a acquires the data table from the first storage area of the non-volatile memory 11e (step S3; see the table 1). Based on the acquired data table, the FPGA 72a sets the output voltage for each of the first power circuit 21 to the sixth power circuit 26 (step S4). That is, the first power circuit 21 is set at 31V, the second power circuit 22 at 29V, the third power circuit 23 at 27V, the fourth power circuit 24 at 25V, the fifth power circuit 25 at 23V, and the sixth power circuit 26 at 21V. Further, based on the acquired data table, the FPGA 72a associates the identifier of each nozzle 11a with one of the first power circuit 21 to the sixth power circuit 26 (step S4).

The FPGA 72a acquires the voltage from each of the first power circuit 21 to the sixth power circuit 26 via the power I/F 72c (step S5). The FPGA 72a determines whether or not the acquired voltage corresponds to the set output voltage (the set voltage) throughout the first power circuit 21 to the sixth power circuit 26 (step S6). For example, in the step S6, if the set voltage of the first power circuit 21 is 31V, then the FPGA 72a determines whether the acquired voltage of the first power circuit 21 is within the range from 29.5V to 31.5V. Further, the range mentioned here is set appropriately according to the specification of the power circuit.

If it is determined that the acquired voltage corresponds to the set voltage throughout the first power circuit 21 to the sixth power circuit 26 (step S6: Yes), then the FPGA 72a carries out the step S1. If it is determined that the acquired voltage does not correspond to the set voltage with respect to at least one of the first power circuit 21 to the sixth power circuit 26 (step S6: No), then the step S7 is carried out. In the step S7, the FPGA 72a sets an abnormal flag with such one(s) of the power circuits 21 to 26 that the acquired voltage does not correspond to the set voltage, that is, the abnormal one(s) of the power circuits 21 to 26 (step S7). Hereinbelow, any of the power circuits 21 to 26 set with the abnormal flag will be referred to as an abnormal power circuit.

After the step S7, the FPGA 72a carries out the aftermentioned resetting process (step S8) and stores the data table after the resetting process in the second storage area (step S9). After the step S9, the FPGA 72a transmits the information indicating failure of the power circuits 21 to 26 to the external device 9 (step S10) and, thereafter, carries out the step S1.

In the step S2, if the information indicating failure of the power circuits 21 to 26 is received from the external device 9 (step S2: Yes), then the FPGA 72a acquires the data table from the second storage area (step S11). After the step S11, the FPGA 72a carries out the step S4.

Figure 8A:
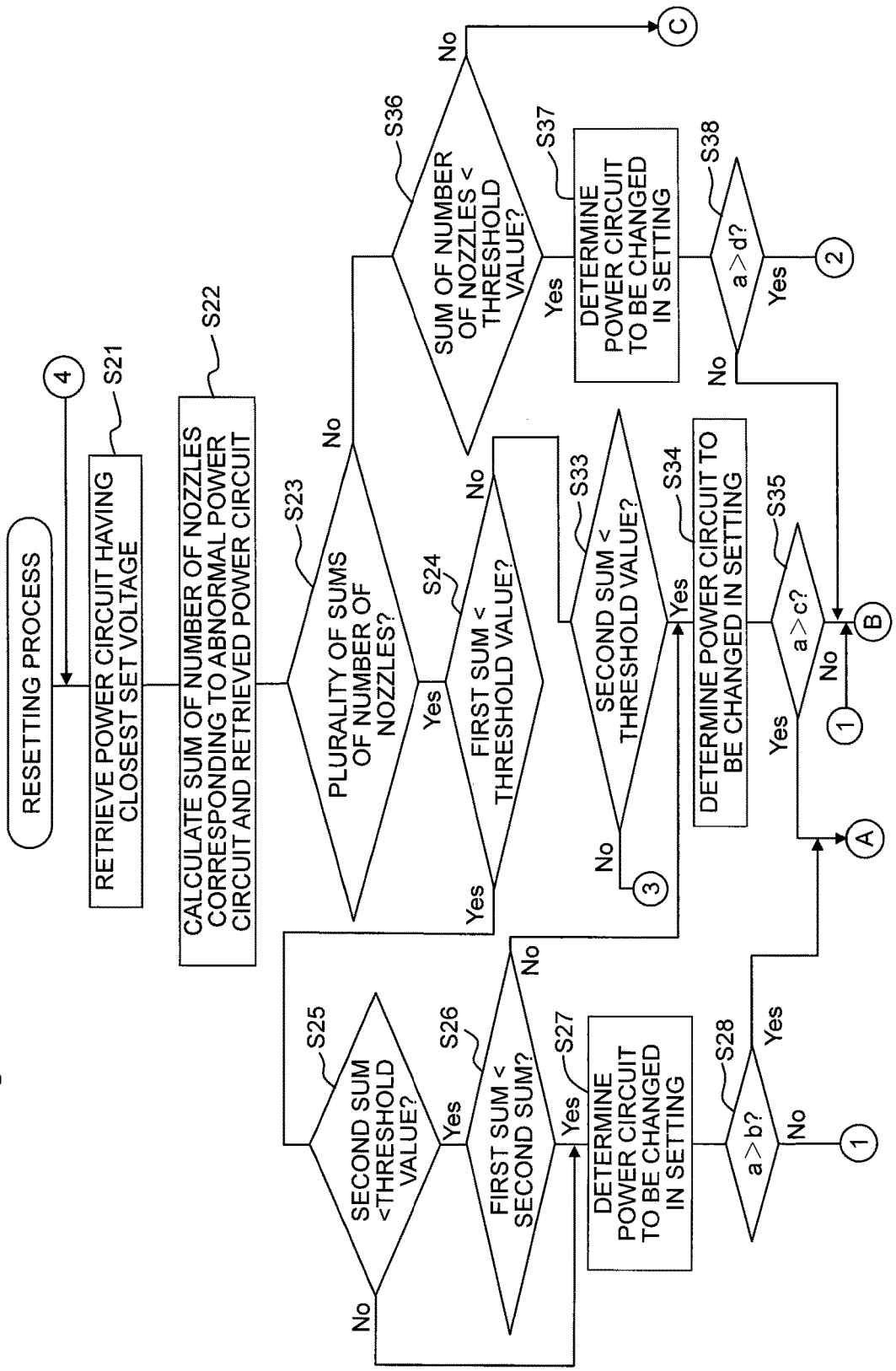
FIGS. 8A and 8B are a flowchart explaining a resetting process.
Figure 8B:
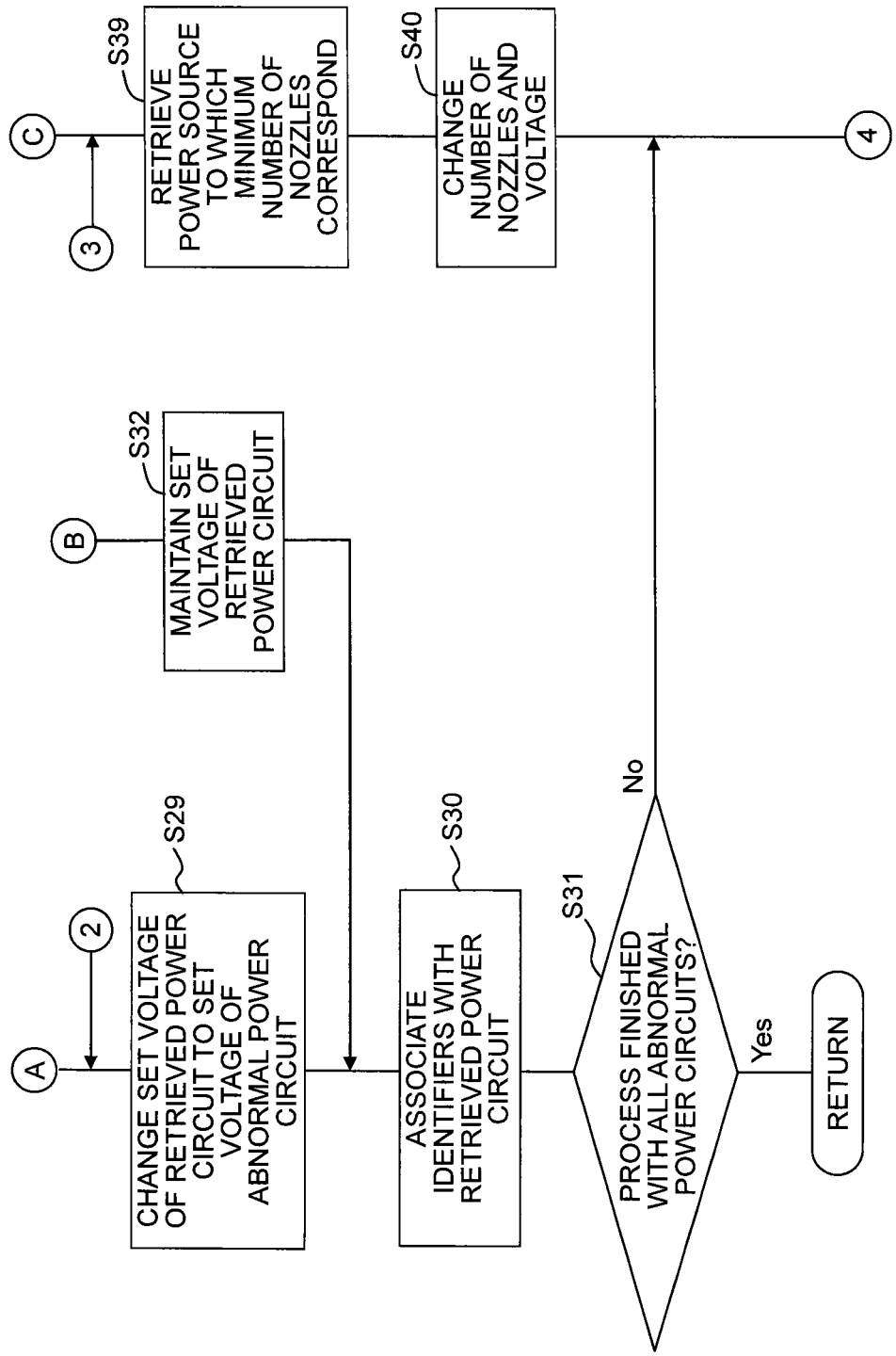

The step S3 or the step S11 corresponds to the read-out process, the step S4 corresponds to the setting process, the step S2 corresponds to the failure detection process, and the step S8 corresponds to the resetting process (see FIGS. 8A and 8B).

Next, referring to FIGS. 8A and 8B, the resetting process of the step S8 will be explained. In the step S8, the FPGA 72a retrieves such one or more of the power circuits 21 to 26 having the closest set voltage to the set voltage of the abnormal power circuit (step S21). As described earlier on, the abnormal power circuit(s) corresponds to such one(s) of the power circuits 21 to 26 as set with the abnormal flag. Further, the retrieved power circuits 21 to 26 may also be referred to below as a retrieved power circuit.

For example, in the table 1, if the second power circuit 22 is set with the abnormal flag, then the FPGA 72a retrieves the first power circuit 21 and the third power circuit 23. Because the set voltage of the second power circuit 22 is 29V, the power circuits with the closest voltages are the first power circuit 21 with the set voltage at 31V and the third power circuit 23 with the set voltage at 27V. That is, if there are two set voltages closest to the set voltage of the abnormal power circuit, then the FPGA 72a retrieves two power circuits. On the other hand, for example, if the first power circuit 21 is set with the abnormal flag, then the FPGA 72a retrieves the second power circuit 22 having the closest set voltage to that of the first power circuit 21. That is, if there is only one set voltage closest to the set voltage of the abnormal power circuit, then the FPGA 72a retrieves one power circuit.

The FPGA 72a calculates the sum of the number of nozzles corresponding to the power circuit set with the abnormal flag and the number of nozzles corresponding to the retrieved power circuit (step S22). For example, if the second power circuit 22 is set with the abnormal flag, then the FPGA 72a calculates the sum (corresponding to an aftermentioned first sum) of the number of nozzles corresponding to the second power circuit 22 and the number of nozzles corresponding to the first power circuit 21. Further, because the set voltage of the second power circuit 22 is closest to the set voltage of the third power circuit 23, the FPGA 72a calculates the sum (corresponding to an aftermentioned second sum) of the number of nozzles corresponding to the second power circuit 22 and the number of nozzles corresponding to the third power circuit 23. That is, if there are two set voltages closest to the set voltage of the abnormal power circuit, then the FPGA 72a calculates the sum of the number of nozzles twice. On the other hand, for example, if the first power circuit 21 is set with the abnormal flag, then the FPGA 72a calculates the sum of the number of nozzles corresponding to the first power circuit 21 and the number of nozzles corresponding to the second power circuit 22. That is, if there is only one set voltage closest to the set voltage of the abnormal power circuit, then the FPGA 72a calculates the sum of the number of nozzles once. The FPGA 72a may calculate the sum of the respective ratios of the number of nozzles corresponding to the power circuits 21 to 26.

The FPGA 72a determines whether there are a plurality of sums of the number of nozzles (two in this embodiment) (step S23). If there are a plurality of sums of the number of nozzles (step S23: Yes), then the FPGA 72a determines whether the first sum is less than a threshold value (step S24). The first sum is the sum of the set voltage of the abnormal power circuit and the set voltage of the retrieved power circuit having a higher set voltage than the abnormal power circuit. The threshold value is preset in the non-volatile memory 11e and, for example, is 72 (40% by ratio) when calculated by the ratio with respect to the total number of nozzles 180.

If it is determined that the first sum is less than the threshold value (step S24: Yes), then the FPGA 72a determines whether the second sum is less than the threshold value 72 (40% by ratio) (step S25). The second sum is the sum of the set voltage of the abnormal power circuit and the set voltage of the retrieved power circuit having a lower set voltage than the abnormal power circuit.

If it is determined that the second sum is not less than the threshold value (step S25: No), then the FPGA 72a determines the retrieved power circuit having a higher set voltage than the abnormal power circuit as the power circuit to be changed in the setting (step S27). Thereafter, the FPGA 72a determines whether the number of nozzles "a" of the abnormal power circuit is larger than the number of nozzles "b" of the retrieved power circuit (step S28).

If the number of nozzles "a" of the abnormal power circuit is larger than the number of nozzles "b" of the retrieved power circuit (step S28: Yes), then the FPGA 72a carries out the step S29. In the step S29, the FPGA 72a changes the set voltage of the retrieved power circuit to the set voltage of the abnormal power circuit. Thereafter, the FPGA 72a associates the identifier of each nozzle 11a which has been associated with the abnormal power circuit with the retrieved power circuit (step S30).

For example, if the data table depicted in the table 1 is stored in the first storage area and the abnormal power circuit is the second power circuit 22, then as depicted below in a table 2, the FPGA 72a changes the data table.

TABLE 2

|  | set voltage | identifier | | | | ratio |
|---|---|---|---|---|---|---|
|  |  | ch1 | ch2 | ... | ch180 |  |
| first power circuit | 29 V | 0 | 0 | ... | 1 | 12% |
| second power circuit | 29 V | 0 | 0 | ... | 1 | NG |
| third power circuit | 27 V | 0 | 1 | ... | 0 | 30% |
| fourth power circuit | 25 V | 1 | 0 | ... | 0 | 35% |
| fifth power circuit | 23 V | 0 | 0 | ... | 0 | 20% |
| sixth power circuit | 21 V | 0 | 0 | ... | 0 | 3% |

In the table 2, the thick frame indicates the data corresponding to the abnormal power circuit. The set voltage of the first power circuit 21 is changed from 31V to 29V. Further, the identifier of each nozzle 11a which has been associated with the second power circuit 22 is now associated with the first power circuit 21. For example, the identifier "ch180" in the first power circuit 21 is changed in value from 0 to 1. Further, although the "ratio" of the first power circuit 21 may not be changed, 12% is listed in the table 2 for the sake of convenience. This 12% is equal to the sum of the ratio (2%) (or the number of nozzles) of the nozzles 11a associated with the first power circuit 21 stored in the first storage area and the ratio (10%) (or the number of nozzles) of the nozzles 11a associated with the second power circuit 22 stored in the first storage area.

The FPGA 72a determines whether the resetting process is carried out for all of the abnormal power circuits (step S31). If it is determined that the resetting process is carried out for all of the abnormal power circuits (step S31: Yes), then the FPGA 72a carries out the step S9. Then, in the step S9, the FPGA 72a stores the changed data table in the second storage area.

If it is determined that the resetting process is not carried out for all of the abnormal power circuits (step S31: No), then the FPGA 72a carries out the step S21. If the resetting process is repeated (step S31: No), then the FPGA 72a ignores the abnormal power circuits having changed in the set voltage or having associated with the identifiers. On the other hand, the FPGA 72a carries out the resetting process for the other abnormal power circuits having not changed in the set voltage or having not associated with the identifiers.

In the step S25, if it is determined that the second sum is less than the threshold value (step S25: Yes), then the FPGA 72a determines whether the first sum is smaller than the second sum (step S26).

If it is determined that the first sum is smaller than the second sum (step S26: Yes), then the FPGA 72a carries out the step S27. In the step S27, the FPGA 72a determines the power circuit to be changed in the setting as the retrieved power circuit having a higher set voltage than the abnormal power circuit. Thereafter, the FPGA 72a determines whether the number of nozzles "a" of the abnormal power circuit is larger than the number of nozzles "b" of the retrieved power circuit (step S28).

If it is determined that the number of nozzles "a" of the abnormal power circuit is not larger than the number of nozzles "b" of the retrieved power circuit (step S28: No), then the FPGA 72a carries out the step S32. In the step S32, the FPGA 72a maintains the set voltage of the retrieved power circuit. Thereafter, the FPGA 72a associates the identifier of each nozzle 11a which has been associated with the abnormal power circuit with the retrieved power circuit (step S30).

For example, if the data table depicted below in a table 3 is stored as the initial value in the first storage area and the abnormal power circuit is the second power circuit 22, then as depicted below in a table 4, the FPGA 72a changes the data table. In this case, the retrieved power circuit (the power circuit changed in the setting) is the first power circuit 21.

TABLE 3

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 15% |
| second power circuit | 29 V | 0 | 0 | ... | 1 | 10% |
| third power circuit | 27 V | 0 | 1 | ... | 0 | 18% |
| fourth power circuit | 25 V | 1 | 0 | ... | 0 | 25% |
| fifth power circuit | 23 V | 0 | 0 | ... | 0 | 20% |
| sixth power circuit | 21 V | 0 | 0 | ... | 0 | 12% |

TABLE 4

|  | set voltage | identifier | | | | ratio |
|---|---|---|---|---|---|---|
|  |  | ch1 | ch2 | ... | ch180 |  |
| first power circuit | 31 V | 0 | 0 | ... | 1 | 25% |
| second power circuit | 29 V | 0 | 0 | ... | 1 | NG |
| third power circuit | 27 V | 0 | 1 | ... | 0 | 18% |
| fourth power circuit | 25 V | 1 | 0 | ... | 0 | 25% |
| fifth power circuit | 23 V | 0 | 0 | ... | 0 | 20% |
| sixth power circuit | 21 V | 0 | 0 | ... | 0 | 12% |

In the table 4, the thick frame indicates the data corresponding to the abnormal power circuit. The set voltage of the first power circuit 21 is maintained. Further, the identifier of each nozzle 11a which has been associated with the second power circuit 22 is now associated with the first power circuit 21. For example, the identifier "ch180" in the first power circuit 21 is changed in value from 0 to 1. Although the "ratio" of the first power circuit 21 may not be changed, 25% is listed in the table 4 for the sake of convenience. This 25% is equal to the sum of the ratio (15%) (or the number of nozzles) of the nozzles 11a associated with the first power circuit 21 stored in the first storage area and the ratio (10%) (or the number of nozzles) of the nozzles 11a associated with the second power circuit 22 stored in the first storage area.

In the step S26, if it is determined that the first sum is not smaller than the second sum (step S26: No), then the FPGA 72a carries out the step S34. In the step S34, the FPGA 72a determines the power circuit to be changed in the setting as the retrieved power circuit having a lower set voltage than the abnormal power circuit. For example, if the data table depicted below in a table 5 is stored in the first storage area and the abnormal power circuit is the fourth power circuit 24, then the FPGA 72a determines the fifth power circuit 25 as the retrieved power circuit (the power circuit to be changed in the setting).

TABLE 5

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 10% |
| second power circuit | 29 V | 0 | 0 | ... | 1 | 15% |
| third power circuit | 27 V | 0 | 1 | ... | 0 | 16% |
| fourth power circuit | 25 V | 1 | 0 | ... | 0 | 23% |

TABLE 5-continued

|  | set voltage | identifier | | | | ratio |
|---|---|---|---|---|---|---|
|  |  | ch1 | ch2 | ... | ch180 |  |
| fifth power circuit | 23 V | 0 | 0 | ... | 0 | 15% |
| sixth power circuit | 21 V | 0 | 0 | ... | 0 | 11% |

The FPGA 72a determines whether the number of nozzles "a" of the abnormal power circuit is larger than the number of nozzles "c" of the retrieved power circuit (step S35). If it is determined that the number of nozzles "a" of the abnormal power circuit is larger than the number of nozzles "c" of the retrieved power circuit (step S35: Yes), then the FPGA 72a carries out the step S29. In the step S29, the FPGA 72a changes the set voltage of the retrieved power circuit to the set voltage of the abnormal power circuit (step S29). Thereafter, the FPGA 72a associates the identifier of each nozzle 11a which has been associated with the abnormal power circuit with the retrieved power circuit (step S30).

For example, if the data table depicted above in the table 5 is stored in the first storage area and the abnormal power circuit is the fourth power circuit 24, then the FPGA 72a changes the data table as depicted below in a table 6.

TABLE 6

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 10% |
| second power circuit | 29 V | 0 | 0 | ... | 1 | 15% |
| third power circuit | 27 V | 0 | 1 | ... | 0 | 16% |
| fourth power circuit | 25 V | 1 | 0 | ... | 0 | NG |
| fifth power circuit | 25 V | 1 | 0 | ... | 0 | 38% |
| sixth power circuit | 21 V | 0 | 0 | ... | 0 | 11% |

In the table 6, the thick frame indicates the data corresponding to the abnormal power circuit. The set voltage of the fifth power circuit 25 is changed from 23V to 25V (the set voltage of the abnormal power circuit). Further, the identifier of each nozzle 11a which has been associated with the fourth power circuit 24 is now associated with the fifth power circuit 25. For example, the identifier "ch1" in the fifth power circuit 25 is changed in value from 0 to 1. Although the "ratio" of the fifth power circuit 25 may not be changed, 38% is listed in the table 6 for the sake of convenience. This 38% is equal to the sum of the ratio (23%) (or the number of nozzles) of the nozzles 11a associated with the fourth power circuit 24 stored in the first storage area and the ratio (15%) (or the number of nozzles) of the nozzles 11a associated with the fifth power circuit 25 stored in the first storage area.

In the step S26, if it is determined that the first sum is not smaller than the second sum (step S26: No) and, in the step S35, the number of nozzles "a" of the abnormal power circuit is determined not larger than the number of nozzles "c" of the retrieved power circuit (step S35: No), then the FPGA 72a carries out the step S32. In the step S32, the FPGA 72a maintains the set voltage of the retrieved power circuit (step S32). Thereafter, the FPGA 72a associates the identifier of each nozzle 11a which has been associated with the abnormal power circuit with the retrieved power circuit (step S30).

For example, if the data table depicted below in a table 7 is stored as the initial value in the first storage area and the abnormal power circuit is the second power circuit 22, then as depicted below in a table 8, the FPGA 72a changes the data table. In this case, the retrieved power circuit determined by the FPGA 72a (the power circuit to be changed in the setting) is the third power circuit 23.

TABLE 7

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 18% |
| second power circuit | 29 V | 0 | 0 | ... | 1 | 10% |
| third power circuit | 27 V | 0 | 1 | ... | 0 | 15% |
| fourth power circuit | 25 V | 1 | 0 | ... | 0 | 25% |
| fifth power circuit | 23 V | 0 | 0 | ... | 0 | 20% |
| sixth power circuit | 21 V | 0 | 0 | ... | 0 | 12% |

TABLE 8

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 18% |
| second power circuit | 29 V | 0 | 0 | ... | 1 | NG |
| third power circuit | 27 V | 0 | 1 | ... | 1 | 25% |
| fourth power circuit | 25 V | 1 | 0 | ... | 0 | 25% |
| fifth power circuit | 23 V | 0 | 0 | ... | 0 | 20% |
| sixth power circuit | 21 V | 0 | 0 | ... | 0 | 12% |

In the table 8, the thick frame indicates the data corresponding to the abnormal power circuit. The set voltage of the third power circuit 23 is maintained. Further, the identifier of each nozzle 11a which has been associated with the second power circuit 22 is now associated with the third power circuit 23. For example, the identifier "ch180" in the third power circuit 23 is changed in value from 0 to 1. Although the "ratio" of the third power circuit 23 may not be changed, 25% is listed in the table 8 for the sake of convenience. This 25% is equal to the sum of the ratio (10%) (or the number of nozzles) of the nozzles 11a associated with the second power circuit 22 stored in the first storage area and the ratio (15%) (or the number of nozzles) of the nozzles 11a associated with the third power circuit 23 stored in the first storage area.

In the step S24, if it is determined that the first sum is not less than the threshold value (step S24: No), then the FPGA 72a carries out the step S33. In the step S33, the FPGA 72a determines whether the second sum is less than the threshold value. The second sum is the sum of the set voltage of the abnormal power circuit and the set voltage of the retrieved power circuit having a lower set voltage than the abnormal power circuit.

If it is determined that the second sum is less than the threshold value (step S33: Yes), then the FPGA 72a carries out the step S34. In the step S34, the FPGA 72a determines the power circuit to be changed in the setting as the retrieved power circuit having a lower set voltage than the abnormal power circuit. For example, if the data table depicted in the table 1 is stored in the first storage area and the abnormal power circuit is the fifth power circuit 25, then the FPGA 72a determines the sixth power circuit 26 as the retrieved power circuit.

The FPGA 72a determines whether the number of nozzles "a" of the abnormal power circuit is larger than the number of nozzles "c" of the retrieved power circuit (step S35). If it is determined that the number of nozzles "a" of the abnormal power circuit is larger than the number of nozzles "c" of the retrieved power circuit (step S35: Yes), then the FPGA 72a carries out the step S29. In the step S29, the FPGA 72a changes the set voltage of the retrieved power circuit to the set voltage of the abnormal power circuit. Thereafter, the FPGA 72a associates the identifier of each nozzle 11a which has been associated with the abnormal power circuit with the retrieved power circuit (step S30).

For example, if the data table depicted in the table 1 is stored in the first storage area and the abnormal power circuit is the fifth power circuit 25, then the FPGA 72a changes the data table as depicted below in a table 9.

TABLE 9

|  | set voltage | identifier | | | | ratio |
|---|---|---|---|---|---|---|
|  |  | ch1 | ch2 | ... | ch180 |  |
| first power circuit | 31 V | 0 | 0 | ... | 0 | 2% |
| second power circuit | 29 V | 0 | 0 | ... | 1 | 10% |
| third power circuit | 27 V | 0 | 1 | ... | 0 | 30% |
| fourth power circuit | 25 V | 1 | 0 | ... | 0 | 35% |
| fifth power circuit | 23 V | 0 | 0 | ... | 0 | NG |
| sixth power circuit | 23 V | 0 | 0 | ... | 0 | 23% |

In the table 9, the thick frame indicates the data corresponding to the abnormal power circuit. The set voltage of the sixth power circuit 26 is changed from 21V to 23V (the set voltage of the abnormal power circuit). Further, the identifier of each nozzle 11a which has been associated with the fifth power circuit 25 is now associated with the sixth power circuit 26. Although the "ratio" of the sixth power circuit 26 may not be changed, 23% is listed in the table 9 for the sake of convenience. This 23% is equal to the sum of the ratio (20%) (or the number of nozzles) of the nozzles 11a associated with the fifth power circuit 25 stored in the first storage area and the ratio (3%) (or the number of nozzles) of the nozzles 11a associated with the sixth power circuit 26 stored in the first storage area.

In the step S23, if it is determined that there are not a plurality of sums of the nozzle numbers (or ratios) (step S23: No), then the FPGA 72a carries out the step S36. Note that "there are not a plurality of sums of the nozzle numbers (or ratios)" means that there is only one sum of the nozzle numbers (or ratios). In the step S36, the FPGA 72a determines whether the sum of the nozzle numbers (or ratios) is less than the threshold value. For example, in the table 1, if the first power circuit 21 or the sixth power circuit 26 is the abnormal power circuit, then there is only one sum of the nozzle numbers (or ratios). If the first power circuit 21 is the abnormal power circuit, then the second power circuit 22 is the retrieved power circuit. If the sixth power circuit 26 is the abnormal power circuit, then the fifth power circuit 25 is the retrieved power circuit.

If it is determined that the sum of the nozzle numbers (or ratios) is less than the threshold value (step S36: Yes), then the FPGA 72a determines the retrieved power circuit as the power circuit to be changed in the setting (step S37). The FPGA 72a determines whether the number of nozzles "a" of the abnormal power circuit is larger than the number of nozzles "d" of the retrieved power circuit (step S38).

If it is determined that the number of nozzles (or ratio) "a" of the abnormal power circuit is larger than the number of nozzles (or ratio) "d" of the retrieved power circuit (step S38: Yes), then the FPGA 72a carries out the step S29. If it is determined that the number of nozzles "a" of the abnormal power circuit is not larger than the number of nozzles "d" of the retrieved power circuit (step S38: No), then the FPGA 72a carries out the step S32.

In the step S33, if it is determined that the second sum is determined not less than the threshold value (step S33: No), or in the step S36, if it is determined that the sum of the nozzle numbers (or ratios) is not less than the threshold value (step S36: No), then the FPGA 72a carries out the step S39. In the step S39, the FPGA 72a retrieves the power circuit with which the minimum number of nozzles are associated (to be referred to below as the power circuit of the minimum number of nozzles). Thereafter, the FPGA 72a makes an exchange between the set voltage of the power circuit of the minimum number of nozzles and the set voltage of the abnormal power circuit, and another exchange between the identifier of each nozzle 11a associated with the abnormal power circuit and the identifier of each nozzle 11a associated with the power circuit of the minimum number of nozzles (step S40). Then, the FPGA 72a carries out the step S21.

For example, if the data table depicted in the table 1 is stored in the first storage area and the abnormal power circuit is the fourth power circuit 24, then as depicted below in a table 10, the FPGA 72a changes the data table.

TABLE 10

|  | set voltage | identifier | | | | ratio |
|---|---|---|---|---|---|---|
|  |  | ch1 | ch2 | ... | ch180 |  |
| first power circuit | 25 V | 1 | 0 | ... | 0 | 35% |
| second power circuit | 29 V | 0 | 0 | ... | 1 | 10% |
| third power circuit | 27 V | 0 | 1 | ... | 0 | 30% |
| fourth power circuit | 31 V | 0 | 0 | ... | 0 | 2% |
| fifth power circuit | 23 V | 0 | 0 | ... | 0 | 20% |
| sixth power circuit | 21 V | 0 | 0 | ... | 0 | 3% |

In the table 10, the thick frame indicates the data corresponding to the abnormal power circuit. The exchange has been made between the set voltage (25V) of the fourth power circuit 24 and the set voltage (31V) of the first power circuit 21. Further, the other exchange has been made between the identifier of each nozzle 11a associated with the fourth power circuit 24 and the identifier of each nozzle 11a associated with the first power circuit 21. For example, the identifier "ch1" corresponding to the first nozzle 11a is, in the table 10, "0" in the fourth power circuit 24 but "1" in the first power circuit 21. Although the "ratio" of the first power circuit 21 and the fourth power circuit 24 may not be changed, 35% and 2% are listed respectively in the table 10 for the sake of convenience. This 35% is the ratio (35%) (or the number of nozzles) of the nozzles 11a associated with the fourth power circuit 24 stored in the first storage area. This 2% is the ratio (2%) (or the number of nozzles) of nozzles 11a associated with the first power circuit 21 stored in the first storage area.

In the state of the above table 10, the FPGA 72a carries out the step S21. As a result, the data table is changed as depicted below in a table 11.

TABLE 11

|  | set voltage | identifier ch1 | ch2 | ... | ch180 | ratio |
|---|---|---|---|---|---|---|
| first power circuit | 25 V | 1 | 0 | ... | 0 | 35% |
| second power circuit | 29 V | 0 | 0 | ... | 1 | 12% |
| third power circuit | 27 V | 0 | 1 | ... | 0 | 30% |
| fourth power circuit | 31 V | 0 | 0 | ... | 0 | NG |
| fifth power circuit | 23 V | 0 | 0 | ... | 0 | 20% |
| sixth power circuit | 21 V | 0 | 0 | ... | 0 | 3% |

While there is no illustration in the table 11, the identifier of each nozzle 11a associated with the fourth power circuit 24 in the data table depicted by the table 10 is now associated with the second power circuit 22. Although the "ratio" of the second power circuit 22 may not be changed, 12% is listed in the table 11 for the sake of convenience. This 12% is equal to the sum of the ratio (10%) (or the number of nozzles) of the nozzles 11a associated with the second power circuit 22 stored in the second storage area (depicted in the table 10) and the ratio (2%) (or the number of nozzles) of the nozzles 11a associated with the fourth power circuit 24 stored in the second storage area (depicted in the table 10).

The printing apparatus according to the first embodiment sets any of the power circuits 21 to 26 without failure for the identifiers of the nozzles 11a associated with one of the power circuits 21 to 26 with failure. Therefore, even if there is a problem with any of the power circuits 21 to 26, it is still possible to continuously drive the piezoelectric bodies 11b and 11b' (the actuators).

Further, the above printing apparatus allocates the identifiers of the nozzles 11a associated with one of the power circuits 21 to 26 with failure to any of the (normal) power circuits 21 to 26 not having failure and having the closest voltage to the voltage of the abnormal power circuit. This realizes the continuous driving of the piezoelectric bodies 11b and 11b'.

Further, the above printing apparatus sets the identifiers of the nozzles 11a associated with the abnormal power circuit for any of the normal power circuits 21 to 26 having the minimum number of nozzles (the actuator number), if there is a plurality of normal power circuits 21 to 26 having the closest voltage to the voltage of the abnormal power circuit. This realizes the continuous driving of the piezoelectric bodies 11b and 11b'.

Further, the printing apparatus exchanges the identifiers associated with the abnormal power circuit and the voltage of the abnormal power circuit respectively for the identifiers associated with any of the normal power circuits 21 to 26 having the minimum number of nozzles (the minimum number of actuators) and the voltage of any of the normal power circuits 21 to 26 having the minimum number of nozzles, if t the sum of the number of nozzles associated with any of the normal power circuits 21 to 26 having the closest voltage to the voltage of the abnormal power circuit and the number of nozzles (the number of actuators) associated with the abnormal circuit is not less than the threshold value. Then, the above printing apparatus retrieves, again, another normal power circuit having the closest voltage to the voltage of the abnormal power circuit.

Further, the controller 7 includes the FPGA 72a. The bit stream information for constructing the logic circuit of the FPGA 72a is stored in, for example, the non-volatile memory 11e. The bit stream information includes information for constructing the logic circuit to realize the process of setting any of the normal power circuits for the identifiers of the nozzles 11a associated with the abnormal power circuit.

In this embodiment, the controller 7 may be constructed of dedicated hardware such as the ASIC 721 to carry out the process of setting any of the normal power circuits for the identifiers of the nozzles 11a associated with the normal power circuit.

Second Embodiment

Figure 9:
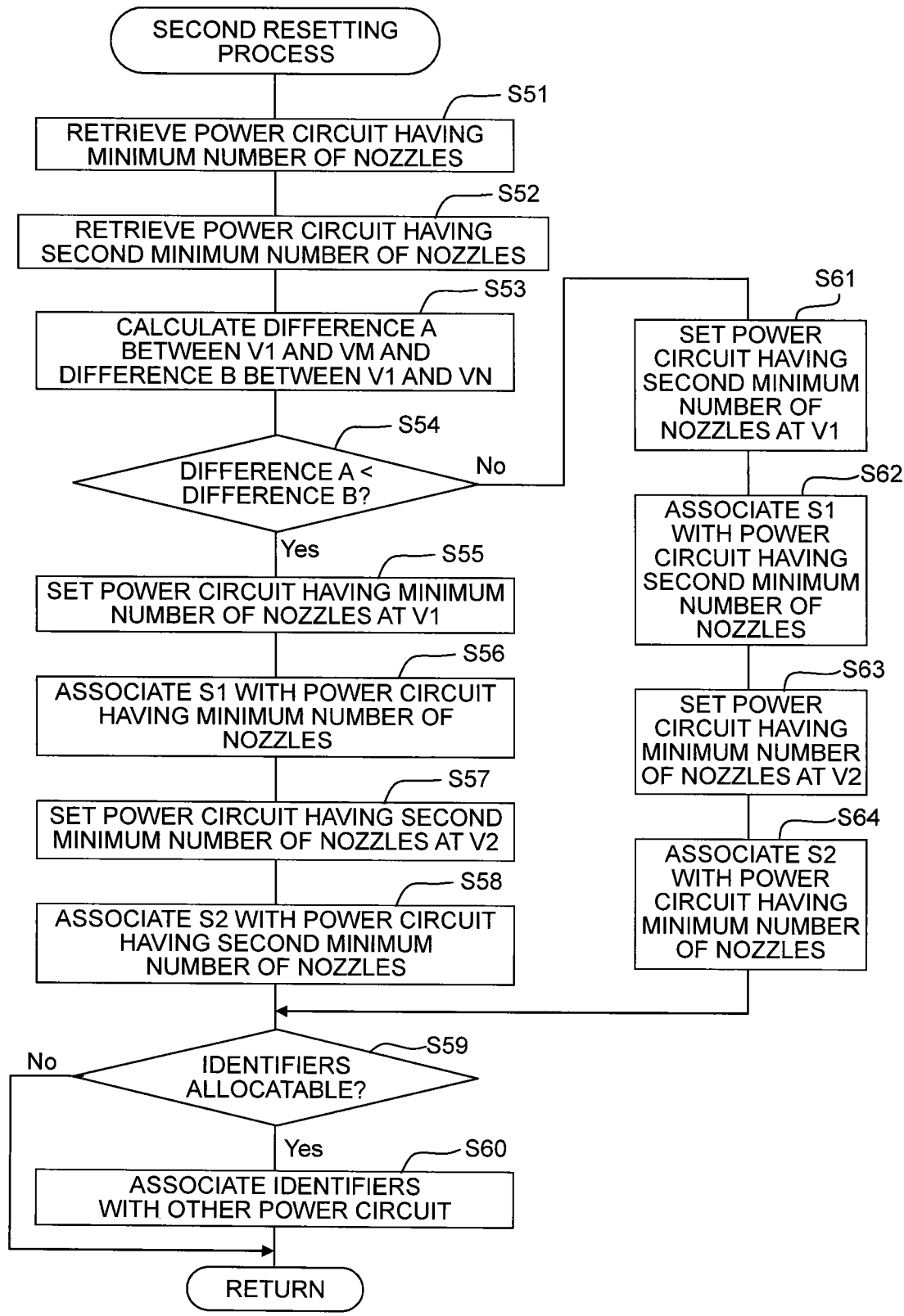
FIG. 9 is a flowchart explaining a second resetting process according to a second embodiment of the present teaching.

Based on the accompanying drawings, a printing apparatus according to a second embodiment will be explained below. The FPGA 72a may carry out a second setting process (see FIG. 9) explained below instead of the resetting process mentioned earlier on, if a plurality of abnormal power circuits is detected in the abovementioned voltage setting process.

The following explanation will be made on a case of detecting two abnormal power circuits. The two abnormal power circuits will be referred to respectively as a first abnormal power circuit and a second abnormal power circuit. Further, the set voltage of the first abnormal power circuit is referred to as a first set voltage V1 and the identifiers associated therewith are referred to as first identifiers S1. Further, the set voltage of the second abnormal power circuit is referred to as a second set voltage V2 and the identifiers associated therewith are referred to as second identifiers S2. Further, the set voltage of the power circuit having the minimum number of nozzles (to be referred to below as the "power circuit of the minimum number of nozzles") is referred to as Vm. The set voltage of the power circuit having the second minimum number of nozzles next to the minimum number of nozzles (to be referred to below as the power circuit of the second minimum number of nozzles) is referred to as Vn.

The FPGA 72a retrieves the power circuit having the minimum number of nozzles (step S51), and retrieves the power circuit of the second minimum number of nozzles (step S52). The FPGA 72a calculates a difference "A" between V1 and Vm and a difference "B" between V1 and Vn (step S53), and determines whether the difference "A" is smaller than the difference "B" (step S54).

If it is determined that the difference "A" is smaller than the difference "B" (step S54: Yes), then the FPGA 72a carries out the step S55. The case of the difference "A" being smaller than the difference "B" refers to such a case that the first set voltage V1 is closer to Vm than to Vn. In the step S55, the FPGA 72a sets the power circuit of the minimum number of nozzles at the first set voltage V1. Thereafter, the FPGA 72a associates the first identifiers S1 with the power circuit of the minimum number of nozzles (step S56). Further, the FPGA 72a sets the power circuit of the second minimum number of nozzles at the second set voltage V2 (step S57). Then, the FPGA 72a associates the second identifiers S2 with the power circuit of the second minimum number of nozzles (step S58).

The FPGA 72a determines whether it is possible to allocate the identifiers of the power circuit of the minimum number of nozzles and the power circuit of the second minimum number of nozzles to other power circuits having the closest set voltage (step S59). If it is determined that it is possible to allocate the identifiers to the other power circuits (step S59: Yes), then the FPGA 72a associates the identifiers of the power circuit of the minimum number of nozzles and the power circuit of the second minimum number of nozzles with the other power circuits (step S60).

Figure 7:
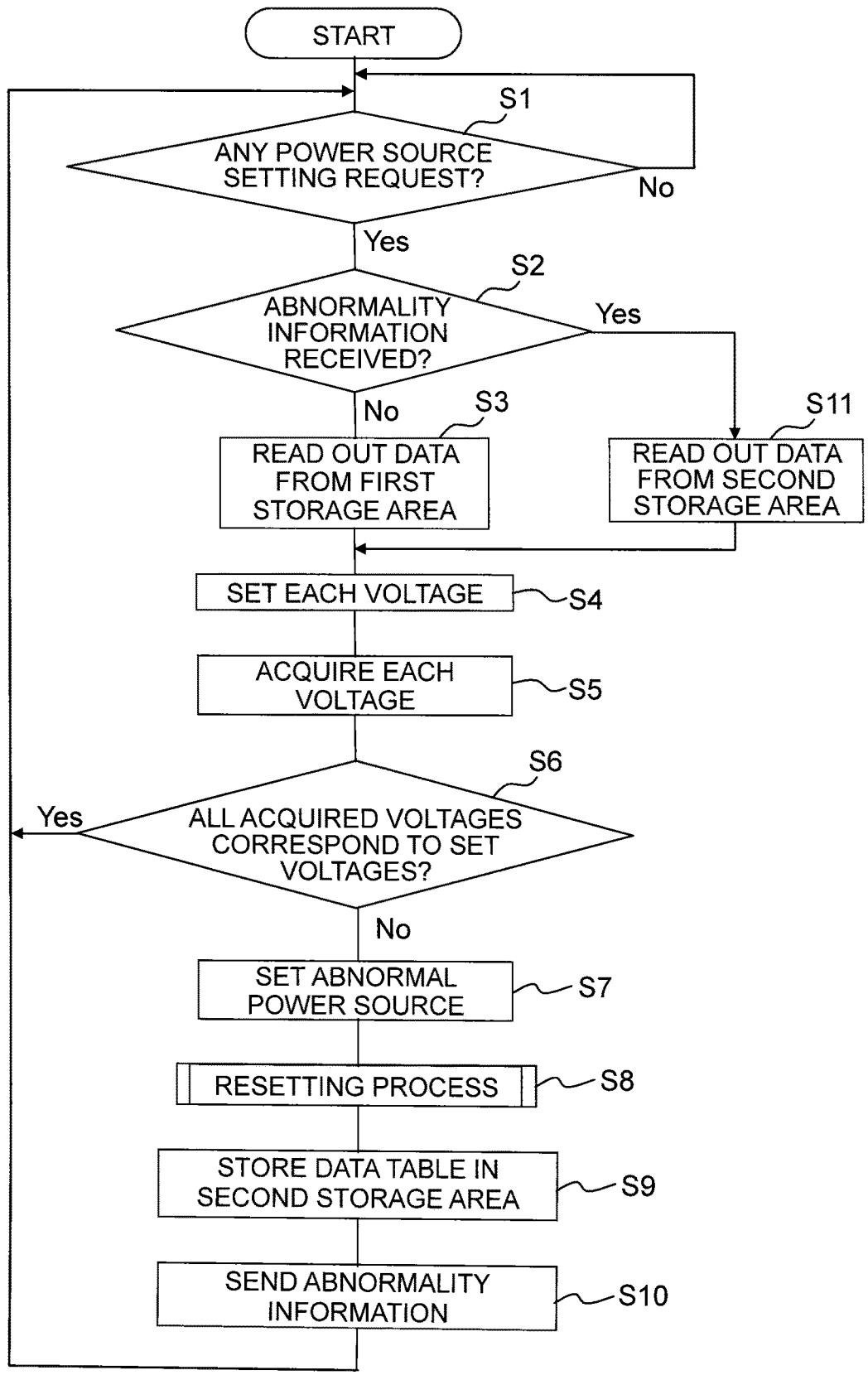
FIG. 7 is a flowchart explaining a voltage setting process.

Thereafter, the FPGA 72a carries out the step S9 of FIG. 7. If it is determined that it is not possible to allocate the identifiers to the other power circuits (step S59: No), then the FPGA 72a carries out the step S9 of FIG. 7.

If it is determined that the difference "A" is not smaller than the difference "B" (step S54: No), then the FPGA 72a carries out the step S61. The case of the difference "A" being not smaller than the difference "B" refers to such a case that the first set voltage V1 is closer to Vn than to Vm. In the step S61, the FPGA 72a sets the power circuit of the second minimum number of nozzles at the first set voltage V1. Thereafter, the FPGA 72a associates the first identifiers S1 with the power circuit of the second minimum number of nozzles (step S62). Further, the FPGA 72a sets the power circuit of the minimum number of nozzles at the second set voltage V2 (step S63). Then, the FPGA 72a associates the second identifiers S2 with the power circuit of the minimum number of nozzles (step S64), and carries out the step S59.

For example, if the data table depicted in the table 1 is stored in the first storage area and the first abnormal power circuit is the second power circuit 22 and the second abnormal power circuit is the fourth power circuit 24, then the data table is changed as depicted below in a table 12.

TABLE 12

|  | set voltage | identifier | | | | ratio |
| --- | --- | --- | --- | --- | --- | --- |
|  |  | ch1 | ch2 | ... | ch180 |  |
| first power circuit | 29 V | 0 | 0 | ... | 1 | 12% |
| second power circuit | 29 V | 0 | 0 | ... | 1 | NG |
| third power circuit | 27 V | 0 | 1 | ... | 0 | 30% |
| fourth power circuit | 25 V | 1 | 0 | ... | 0 | NG |
| fifth power circuit | 23 V | 0 | 0 | ... | 0 | 23% |
| sixth power circuit | 25 V | 1 | 0 | ... | 0 | 35% |

In the table 12, the thick frame indicates the data corresponding to the abnormal power circuit. The power circuit of the minimum number of nozzles is the first power circuit 21, and the power circuit of the second minimum number of nozzles is the sixth power circuit 26. Because the set voltage of the second power circuit 22 is closer to the set voltage of the first power circuit 21 than to the sixth power circuit 26, the set voltage of the first power circuit 21 is changed to the set voltage of the second power circuit 22.

Because the set voltage of the fourth power circuit 24 is closer to the set voltage of the sixth power circuit 26 than to the set voltage of the first power circuit 21, the set voltage of the sixth power circuit 26 is changed to the set voltage of the fourth power circuit 24.

Because the second power circuit 22 is the abnormal power circuit, it is not possible to associate the identifiers of the first power circuit 21 with the second power circuit 22 at the closest set voltage. Therefore, the identifiers of the first power circuit 21 are not associated with any other power circuit.

On the other hand, because the fifth power circuit 25 is not an abnormal power circuit, it is possible to associate the identifiers of the sixth power circuit 26 with the fifth power circuit 25. Hence, the identifiers of the sixth power circuit 26 are associated with the fifth power circuit 25. Although the "ratio" of the first power circuit 21, the fifth power circuit 25 and the sixth power circuit 26 may not be changed, 12%, 23% and 35% are listed respectively in the table 12 for the sake of convenience. This 12% is equal to the sum of the ratio (2%) (or the number of nozzles) of the nozzles 11a associated with the first power circuit 21 stored in the first storage area and the ratio (10%) (or the number of nozzles) of the nozzles 11a associated with the second power circuit 22. The 23% is equal to the sum of the ratio (20%) (or the number of nozzles) of the nozzles 11a associated with the fifth power circuit 25 stored in the first storage area and the ratio (3%) (or the number of nozzles) of the nozzles 11a associated with the sixth power circuit 26. The 35% is equal to the ratio (35%) (or the number of nozzles) of the nozzles 11a associated with the fourth power circuit 24 stored in the first storage area.

In the second embodiment, the continuous driving of the nozzles 11a is realized by setting the identifiers of the abnormal power circuit for the normal power circuits having the minimum number of nozzles or the second smallest number of nozzles next to the minimum number of nozzles.

Figure 10:
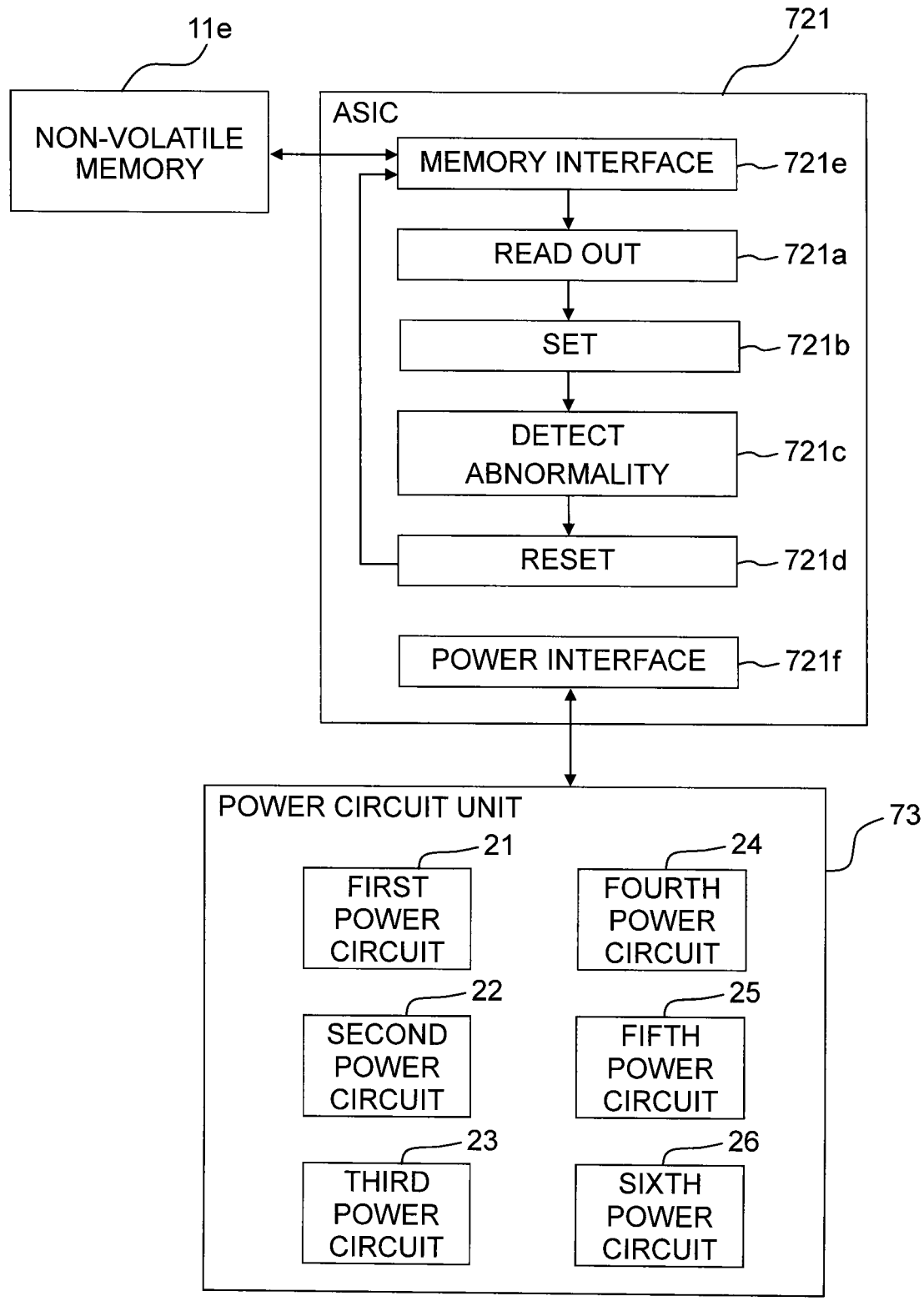
FIG. 10 is a functional block diagram of an ASIC configuration.

In the above embodiments, the ASIC 721 depicted in FIG. 10A may be used instead of the FPGA 72a. The ASIC 721 configured to: read out, from the non-volatile memory 11e, identifiers associated with power circuits and voltages of the power circuits (721a); set each identifier with any of the power circuits 21 to 26 based on each voltage read out (721b); detect whether there is any failure in the power circuits (721c); and reset each of the identifiers with any of normal power circuits if there is any failure in the power circuits (721d). The ASIC 721 includes a memory interface 721e, and a power interface 721f. The memory interface 721e carries out communications with memories. The power interface 721f carries out communications with the power circuits 21 to 26. The ASIC 721 carries out the abovementioned voltage setting process, resetting process, and second resetting process. Further, instead of the FPGA, a processor such as a CPU or the like may carry out the programs representing the abovementioned voltage setting process, resetting process, and second resetting process.

The embodiments disclosed above should be considered as exemplary but not as limitary in each and every aspect. It is possible to mutually combine the technical characteristics described in the respective embodiments, and the scope of those embodiments is intended to include all changes within the scope of the appended claims and an equal scope to the scope of the appended claims.

What is claimed is:

1. A control circuit comprising:
   a memory interface; and
   a power interface,
   wherein the control circuit is configured to:
      read out identifiers and voltage values from a memory via the memory interface, the memory storing the identifiers and the voltage values associated with the identifiers, the identifiers identifying actuators for jetting liquid, the voltage values corresponding to values of voltages to be supplied to the actuators;
      based on the read out voltage values, associate each of the read out identifiers with one of power circuits, the power circuits being different in output voltage, each of the power circuits being changeable in the output voltage;
      detect a failure power circuit via the power interface communicated with the power circuits, the failure power circuit being included in the power circuits and having failure occurred therein; and
      based on detection of the failure power circuit,
         determine each of non-failure power circuits having the closest output voltage to the output voltage of the failure power circuit, the non-failure power circuits being included in the power circuits and having no failure occurred therein; and associate specified identifiers, which are associated with the failure power circuit, with each of the determined non-failure power circuits.

2. The control circuit according to claim 1, wherein the control circuit is configured to associate the specified identifiers with the any of non-failure power circuits with which the minimum number of identifiers are associated.

3. The control circuit according to claim 1, wherein the control circuit is configured to:
determine whether a sum of the number of the specified identifiers and the number of identifiers associated with the each of the non-failure power circuits is less than a predetermined threshold value; and
based on determination that the sum is less than the threshold value, associate the specified identifiers with the each of the non-failure power circuits.

4. The control circuit according to claim 3, wherein the control circuit is configured to;
based on determination that the sum is not less than the threshold value, retrieve a power circuit with which minimum number of identifiers are associated among the non-failure power circuits;
make exchanges between identifiers associated with the retrieved power circuit and the specified identifiers and;
make exchanges between the output voltage of the retrieved power circuit and the output voltage of the failure power circuit.

5. The control circuit according to claim 4, wherein the control circuit is configured to determine whether a sum of the number of the exchanged identifiers corresponding to the specified identifiers and the number of the identifiers associated with one of non-failure power circuits having the closest output voltage to the exchanged output voltage of the failure power circuit is less than the threshold value.

6. The control circuit according to claim 1, further comprising:
electric circuits; and
a receiving interface to communicate with another memory storing bit stream information,
wherein the control circuit is a FPGA which establishes a connection between the electric circuits according to the bit stream information received from the another memory via the receiving interface.

7. The control circuit according to claim 1, further comprising electric circuits,
wherein the control circuit is a FPGA which establishes a connection between the electric circuits according to bit stream information stored in the memory and received from the memory via the memory interface.

8. An ink-jet head system comprising:
the control circuit as defined in claim 1;
an ink-jet head having the actuators;
the power circuits connected to the actuators; and
the memory.

9. A control circuit comprising:
a memory interface;
a power interface; and
an ASIC configured to:
read out identifiers and voltage values from a memory via the memory interface, the memory storing the identifiers and the voltage values associated with the identifiers, the identifiers identifying actuators for jetting liquid, the voltage values corresponding to values of voltages to be supplied to the actuators;
based on the read out voltage values, associate each of the read out identifiers with one of power circuits, the power circuits being different in output voltage, each of the power circuits being changeable in the output voltage;
detect a failure power circuit via the power interface communicated with the power circuits, the failure power circuit being included in the power circuits and having failure occurred therein; and
based on detection of the failure power circuit,
determine each of non-failure power circuits having the closest output voltage to the output voltage of the failure power circuit, the non-failure power circuits being included in the power circuits and having no failure occurred therein; and
associate specified identifiers, which are associated with the failure power circuit, with each of the determined non-failure power circuits.

10. A control method by a controller connected to power circuits, comprising:
reading out identifiers and voltage values from a memory via a memory interface, the memory storing the identifiers and the voltage values associated with the identifiers, the identifiers identifying actuators for jetting liquid, the voltage values corresponding to values of voltages to be supplied to the actuators;
based on the read out voltage values, associating each of the read out identifiers with one of the power circuits, the power circuits being different in output voltage, each of the power circuits being changeable in the output voltage;
detecting a failure power circuit via a power interface connected to the power circuits, the failure power circuit being included in the power circuits and having failure occurred therein; and
based on detection of the failure power circuit,
determining each of non-failure power circuits having the closest output voltage to the output voltage of the failure power circuit, the non-failure power circuits being included in the power circuits and having no failure occurred therein; and
associating specified identifiers, which are associated with the failure power circuit, with each of the determined non-failure power circuits.

11. A control circuit comprising:
a memory interface; and
a power interface,
wherein the control circuit is configured to:
read out identifiers and voltage values from a memory via the memory interface, the memory storing the identifiers and the voltage values associated with the identifiers, the identifiers identifying actuators for jetting liquid, the voltage values corresponding to values of voltages to be supplied to the actuators;
based on the read out voltage values, associate each of the read out identifiers with one of power circuits, each of the power circuits being changeable in the output voltage;
detect a failure power circuit via the power interface communicated with the power circuits, the failure power circuit being included in the power circuits and having failure occurred therein; and
based on detection of the failure power circuit,
determine each of non-failure power circuits with which the minimum number of identifiers are associated, the non-failure power circuits being included in the power circuits and having no failure occurred therein; and associate specified identifiers, which are associated with the failure power circuit, with each of the determined non-failure power circuits.

12. The control circuit according to claim 11, further comprising:
   electric circuits; and
   a receiving interface to communicate with another memory storing bit stream information,
   wherein the control circuit is a FPGA which establishes a connection between the electric circuits according to the bit stream information received from the another memory via the receiving interface.

13. The control circuit according to claim 11, further comprising electric circuits,
   wherein the control circuit is a FPGA which establishes a connection between the electric circuits according to bit stream information stored in the memory and received from the memory via the memory interface.

14. An ink-jet head system comprising:
   the control circuit as defined in claim 11;
   an ink-jet head having the actuators;
   the power circuits connected to the actuators; and
   the memory.

15. A control circuit comprising:
   a memory interface;
   a power interface; and
   an ASIC configured to:
      read out identifiers and voltage values from a memory via the memory interface, the memory storing the identifiers and the voltage values associated with the identifiers, the identifiers identifying actuators for jetting liquid, the voltage values corresponding to values of voltages to be supplied to the actuators;
      based on the read out voltage values, associate each of the read out identifiers with one of power circuits, each of the power circuits being changeable in the output voltage;
      detect a failure power circuit via the power interface communicated with the power circuits, the failure power circuit being included in the power circuits and having failure occurred therein; and
      based on detection of the failure power circuit,
         determine each of non-failure power circuits with which the minimum number of identifiers are associated, the non-failure power circuits being included in the power circuits and having no failure occurred therein; and
         associate specified identifiers, which are associated with the failure power circuit, with each of the determined non-failure power circuits.

16. A control method by a controller connected to power circuits, comprising:
   reading out identifiers and voltage values from a memory via a memory interface, the memory storing the identifiers and the voltage values associated with the identifiers, the identifiers identifying actuators for jetting liquid, the voltage values corresponding to values of voltages to be supplied to the actuators;
   based on the read out voltage values, associating each of the read out identifiers with one of the power circuits, each of the power circuits being changeable in the output voltage;
   detecting a failure power circuit via a power interface connected to the power circuits, the failure power circuit being included in the power circuits and having failure occurred therein; and
   based on detection of the failure power circuit,
      determining each of non-failure power circuits with which the minimum number of identifiers are associated, the non-failure power circuits being included in the power circuits and having no failure occurred therein; and
      associating specified identifiers, which are associated with the failure power circuit, with each of the determined non-failure power circuits.

* * * * *